United States Patent
Chou et al.

(10) Patent No.: US 7,812,526 B2
(45) Date of Patent: Oct. 12, 2010

(54) STRUCTURE OF LIALO$_2$ SUBSTRATE HAVING ZNO BUFFER LAYER

(75) Inventors: Mitch M. C. Chou, Chiayi (TW); Jih-Jen Wu, Kaohsiung (TW); Wen-Ching Hsu, Hsinchu (TW)

(73) Assignee: National Sun Yat-sen University, Kaohsiung (TW)

( * ) Notice: Subject to any disclaimer, the term of this patent is extended or adjusted under 35 U.S.C. 154(b) by 607 days.

(21) Appl. No.: 11/808,564

(22) Filed: Jun. 11, 2007

(65) Prior Publication Data

US 2008/0233415 A1  Sep. 25, 2008

(30) Foreign Application Priority Data

Mar. 22, 2007  (TW) ............... 96110017 A

(51) Int. Cl.
*H01L 51/50* (2006.01)
*H05B 33/00* (2006.01)
*B32B 9/00* (2006.01)
*B32B 9/04* (2006.01)

(52) U.S. Cl. ............ 313/506; 313/509; 428/469; 428/471; 428/472.2

(58) Field of Classification Search ......... 313/498–512; 257/98–100; 428/469, 471, 472.2
See application file for complete search history.

(56) References Cited

U.S. PATENT DOCUMENTS

2001/0000916 A1 *  5/2001  Kadota ............... 257/43

FOREIGN PATENT DOCUMENTS

| CN | 1635191 A | * | 7/2005 |
| JP | 2001072498 A | * | 3/2001 |

* cited by examiner

*Primary Examiner*—Mariceli Santiago
(74) *Attorney, Agent, or Firm*—Jackson IPG PLLC; Demian K. Jackson

(57) ABSTRACT

A lithium aluminum oxide (LiAlO$_2$) substrate suitable for a zinc oxide (ZnO) buffer layer is found. The ZnO buffer layer is grown on the LiAlO$_2$ substrate. Because the LiAlO$_2$ substrate has a similar structure to that of the ZnO buffer layer, a quantum confined stark effect (QCSE) is effectively eliminated. And a photoelectrical device made with the present invention, like a light emitting diode, a piezoelectric material or a laser diode, thus obtains an enhanced light emitting efficiency.

3 Claims, 3 Drawing Sheets

STRUCTURE OF LIALO$_2$ SUBSTRATE HAVING ZNO BUFFER LAYER

FIELD OF THE INVENTION

The present invention relates to a substrate for a zinc oxide (ZnO) buffer layer; more particularly, relates to growing a non-polar ZnO layer on a lithium aluminum oxide (LiAlO$_2$) substrate for effectively eliminating a quantum con fined stark effect (QCSE) by the ZnO having the same direction as that of the LiAlO2 because of a structural similarity.

DESCRIPTION OF THE RELATED ARTS

Light emitting devices, like a light emitting diode (LED), a laser diode (LD), etc., have wide applications and a big potential market. Although some gallium nitride (GaN) based blue-green light emitting devices gain some breakthroughs in recent years, qualities and lifetimes of the devices are still not satisfying. Such a situation mainly comes from the lacking of a matching substrate for GaN.

Concerning a light emitting device using zinc oxide (ZnO), it is not as popular as one using GaN and even has the similar situation for not having a matching substrate. As shown in FIG. 4, a ZnO layer 32 is grown on a sapphire substrate 31. Because the ZnO layer 32 and the sapphire substrate 31 do not have a lattice match, a strain caused by them is match produces a piezoelectric field at a level of million volts per square centimeter (MV/cm$^2$) and a big piezoelectric coefficient is thus formed on the sapphire substrate 31. Owing to QCSE, a wave-function of electrons and holes forms a screening field in a space along a c axle of a built-in field. Such a situation breaks the balance between lattices of the whole structure; and a mismatching as high as 13.6% is reached to down the quality of the crystal interface and to degrade the performance of the device made therewith. Hence the prior arts do not fulfill all users' requests on actual use.

SUMMARY OF THE INVENTION

The main purpose of the present invention is to grow a non-polar ZnO layer on a LiAlO$_2$ substrate for effectively eliminating a QCSE by the ZnO having the same direction as that of the LiAlO$_2$ because of a structural similarity.

To achieve the above purpose, the present invention is a structure of a LiAlO2 substrate having a ZnO buffer layer, where a ZnO buffer layer is grown on a LiAlO$_2$ substrate as a single crystalline thin film for effectively eliminating a QCSE by the ZnO having the same direction as that of the LiAlO$_2$ because of a structural similarity so as to enhance a light emitting efficiency of a photoelectrical device made therewith. Accordingly, a novel structure of LiAlO$_2$ substrate having a ZnO buffer layer is obtained.

BRIEF DESCRIPTIONS OF THE DRAWINGS

Figure 1:
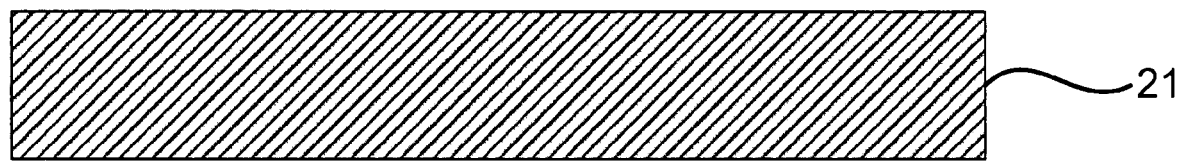
Figure 2:
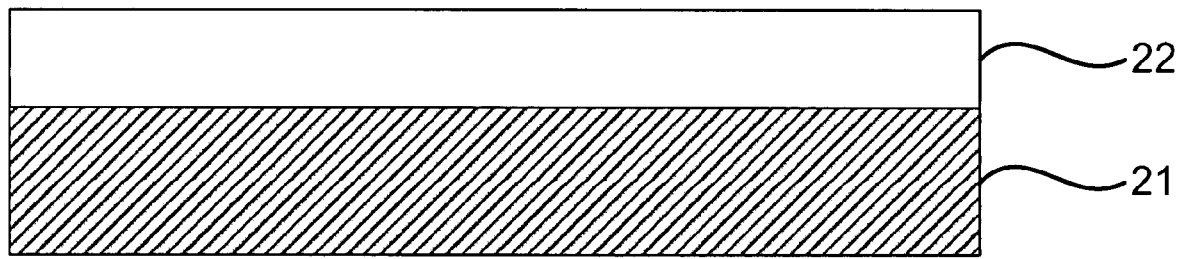
Figure 3:
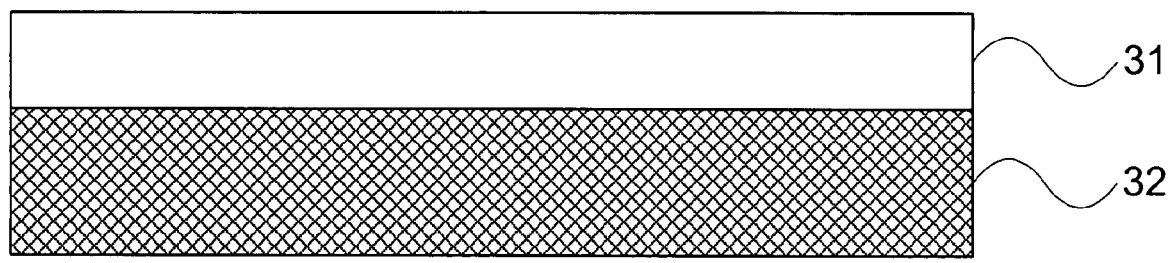

The present invention will be better understood from the following detailed description of the preferred embodiment according to the present invention, taken in con junction with the accompanying drawings, in which FIG. 1 is the view showing the LiAlO$_2$ substrate of the preferred embodiment according to the present invention;

FIG. 2 is the view showing the ZnO buffer layer grown on the LiAlO$_2$ substrate; and FIG. 3 is the view of the prior art.

DESCRIPTION OF THE PREFERRED EMBODIMENT

The following description of the preferred embodiment is provided to understand the features and the structures of the present invention.

Please refer to FIG. 1 and FIG. 2, which are views showing a LiAlO$_2$ substrate and a ZnO buffer layer of a preferred embodiment according to the present invention. As shown in the figures, the present invention is a structure of a lithium aluminum oxide (LiAlO2) substrate having a zinc oxide (ZnO) buffer layer, comprising a substrate made of lithium aluminum oxide (LiAlO$_2$) 21 and a buffer layer made of zinc oxide (ZnO) 22, where a quantum confined stark effect (QCSE) is eliminated to enhance a light emitting efficiency of a photo electrical device made therewith.

The substrate made of LiAlO$_2$ 21 can be further a substrate made of sodium aluminum oxide (NaAlO$_2$), lithium gallium oxide (LiGaO$_2$), sodium silicon oxide (Na$_2$SiO$_3$), sodium zinc silicon oxide (Na$_2$ZnSiO$_4$), lithium silicon oxide (Li$_2$SiO$_3$), lithium zinc silicon oxide (Li$_2$ZnSiO$_4$), lithium magnesium silicon oxide (Li$_2$MgSiO$_4$), lithium cadmium silicon oxide (Li$_2$CdSiO$_4$), sodium germanium oxide (Na$_2$GeO$_3$), sodium zinc germanium oxide (Na$_2$ZnGeO$_4$), sodium magnesium germanium oxide (Na$_2$MgGeO$_4$), lithium germanium oxide (LiGeO$_3$), lithium zinc germanium oxide (Li$_2$ZnGeO$_4$), lithium magnesium germanium oxide (Li$_2$MgGeO$_4$), lithium cadmium germanium oxide (Li$_2$CdGeO$_4$), lithium phosphor oxide (Li$_3$PO$_4$), lithium arsenic oxide (Li$_3$AsO$_4$) or lithium vanadium oxide (Li$_3$VO$_4$).

The ZnO buffer layer 22 is grown on the LiAlO$_2$ substrate 21 as a single crystalline thin film. Thus, with the non-polar ZnO buffer layer 22 grown on the LiAlO$_2$ substrate 21, a quantum confined stark effect (QCSE) is effectively eliminated by the ZnO having the same direction as that of the LiAlO$_2$ because of a structural similarity so as to obtain a lattice match and a good crystal interface. The present invention can be further implanted with a low-dimensional structure of a heterojunction, a multiple quantum well (MQW) or a super lattice for obtaining a photoelectrical device, such as a light emitting diode (LED), a piezoelectric material or a laser diode, with an enhanced light emitting efficiency.

On applying the present invention, the LiAlO$_2$ substrate 21 has a similar structure as that of the ZnO buffer layer 22 so that a structure of the ZnO buffer layer which is a single crystalline thin film on the LiAlO$_2$ substrate 21 is changed into a rectangular solid. Because a Zn—O bonding length in the ZnO buffer layer 22 is close to a Li—O bonding length in the LiAlO$_2$ substrate 21, the quantum confined stark effect (QCSE) is effectively eliminated by the ZnO having the same direction as that of the LiAlO$_2$ so as to obtain the enhanced light emitting efficiency of the photoelectrical device made therewith.

To sum up, the present invention is a structure of a LiAlO$_2$ substrate having a ZnO buffer layer, where a non-polar ZnO buffer layer is grown on a LiAlO$_2$ substrate to effectively eliminate a QCSE by the ZnO having the same direction as that of the LiAlO$_2$ because of a structural similarity so as to obtain an enhanced light emitting efficiency of a photoelectrical device made therewith The preferred embodiment herein disclosed is not intended to limit the scope of the invention unnecessarily. Therefore, simple modifications or variations belonging to the equivalent of the scope of the claims and the instructions disclosed herein for a patent are all within the scope of the present invention.

What is claimed is:

1. A structure of a LiAlO2 substrate having a ZnO buffer layer, comprising:
   a substrate made of lithium aluminum oxide (LiAlO$_2$); and
   a buffer layer made of zinc oxide (ZnO), said ZnO buffer layer being a single crystalline non-polar thin film grown on said LiAlO$_2$ substrate, wherein the substrate and buffer layer have a lattice match.

2. The structure according to claim 1, wherein said structure is further implanted with a low-dimensional structure to obtain a photoelectrical device.

3. The structure according to claim 2, wherein said photoelectrical device is selected from a group consisting of a light emitting diode (LED), a piezoelectric material and a laser diode (LD).

* * * * *